(12) United States Patent
Wright

(10) Patent No.: US 6,445,265 B1
(45) Date of Patent: Sep. 3, 2002

(54) DEVICE WITH ACOUSTIC WAVES GUIDED IN A FINE PIEZOELECTRIC MATERIAL FILM BONDED WITH A MOLECULAR BONDING ON A BEARING SUBSTRATE AND METHOD FOR MAKING SAME

(75) Inventor: Peter Wright, Biot (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/622,894

(22) PCT Filed: Dec. 21, 1999

(86) PCT No.: PCT/FR99/03239
§ 371 (c)(1),
(2), (4) Date: Aug. 30, 2000

(87) PCT Pub. No.: WO00/41299
PCT Pub. Date: Jul. 13, 2000

(30) Foreign Application Priority Data

Dec. 30, 1998 (FR) ............................................. 98 16661

(51) Int. Cl.⁷ ................................................. H03H 9/64
(52) U.S. Cl. .................. 333/193; 333/195; 310/313 B; 310/348; 29/25.35
(58) Field of Search ................................. 333/193–196; 310/313 R, 313 A, 313 B, 313 C, 313 D, 324, 340, 348; 29/25.35

(56) References Cited

U.S. PATENT DOCUMENTS

| 5,446,330 A | * | 8/1995 | Eda et al. ................ 310/313 R |
| 5,448,126 A | * | 9/1995 | Eda et al. ............. 310/313 R X |
| 5,453,652 A | * | 9/1995 | Eda et al. ................ 310/313 R |
| 6,018,211 A | * | 1/2000 | Kanaboshi et al. ...... 310/313 R |
| 6,046,656 A | * | 4/2000 | Mishima ................. 333/193 X |
| 6,236,141 B1 | * | 5/2001 | Sato et al. .............. 310/313 R |

FOREIGN PATENT DOCUMENTS

| EP | 0 350 993 |   | 1/1990 |
| EP | 0 531 985 | * | 3/1993 |
| EP | 0 602 666 |   | 6/1994 |
| EP | 0 616 426 |   | 9/1994 |
| EP | 0 647 022 |   | 4/1995 |

OTHER PUBLICATIONS

U.S. patent application Ser. No. 09/420,939, filed Oct. 19, 1999, pending.
U.S. patent application Ser. No. 09/463,578, filed Jan. 28, 2000, pending.
W.R. Smith, Journal of Applied Physics., vol. 42, No. 7, pp. 3016–3018, "Coupling Efficiency Estimates for Acoustic Surface Wave Excitation with Piezoelectric Film Overlays", Jun. 1971.
C.T. Chuang, et al., IEEE Electron Device Letters, vol. 4, No. 2, pp. 35–38, "Coupling of Interdigital Transducer to Plate Modes in a Slotted Acoustically-Thin Membrane", Feb. 1983.

* cited by examiner

*Primary Examiner*—Benny Lee
*Assistant Examiner*—Barbara Summons
(74) *Attorney, Agent, or Firm*—Oblon, Spivak, McClelland, Maier & Neustadt, P.C.

(57) ABSTRACT

A surface acoustic wave device including a thin layer of piezoelectric material, a layer of molecular bonder, and a carrier substrate. The thin layer constitutes an acoustic energy guide that augments the performance characteristics of the device. A method for making the acoustic wave device includes a step of molecular bonding between a carrier substrate and a piezoelectric substrate, and then a step for reducing the thickness of the piezoelectric substrate.

14 Claims, 7 Drawing Sheets

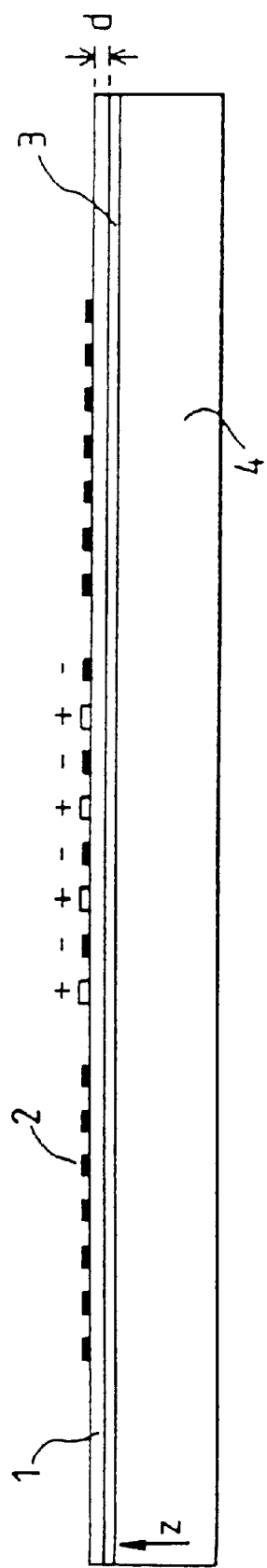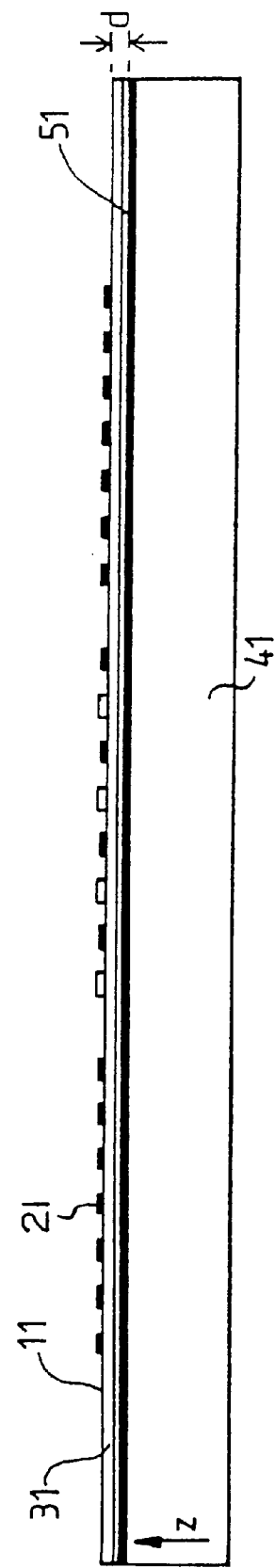

DEVICE WITH ACOUSTIC WAVES GUIDED IN A FINE PIEZOELECTRIC MATERIAL FILM BONDED WITH A MOLECULAR BONDING ON A BEARING SUBSTRATE AND METHOD FOR MAKING SAME

BACKGROUND OF THE INVENTION

1. Field of the Invention

The field of the invention is that of surface acoustic wave devices, especially those used as filters in mobile telephony.

2. Discussion of the Background

To carry out filter and resonator type functions with surface acoustic wave devices, it is important to set up transducer and reflector functions that are as efficient as possible.

Typically, a surface acoustic wave resonator consists of a surface acoustic wave transducer between two arrays of reflective electrodes positioned appropriately so as to trap the acoustic energy and thus create a resonant cavity for which a low reflection loss rate is sought. This can be obtained with lots of electrodes. Indeed, the effective coefficient of reflection of a single electrode is only a few percent. Thus, these arrays are constituted by about a hundred electrodes, or even more, uniformly spaced out at a rate of two electrodes per wavelength. There are essentially two reasons for the weakness of reflection of an electrode: since the electrode is on the surface, it does not react strongly with the acoustic wave whose energy is scattered in the substrate (to substantially increase this interaction would require electrodes of a fineness that cannot be achieved in practice). Furthermore, if the coefficient of reflection of a single electrode is very high, then substantial energy is dispersed in the form of bulk waves and therefore lost for the entire resonator.

To increase the efficiency of the arrays and therefore the performance characteristics of the resonators, it is particularly advantageous to use an acoustic energy guide, namely to use a fine layer of piezoelectric material in which the acoustic wave can be confined.

Surface acoustic wave transducers are increasingly making use of internal reflections to carry out one-directional acoustic transmission. Therefore, this type of transducer benefits in the same way from an increase in reflection efficiency. Furthermore, if the acoustic energy is guided in a thin layer of piezoelectric material, the piezoelectric coupling coefficient is more efficient.

SUMMARY OF THE INVENTION

This is why the invention proposes a device using surface acoustic waves, guided in a thin layer of piezoelectric material bonded to a carrier substrate so as to provide for the confinement of the acoustic waves in the piezoelectric material.

More specifically, an object of the invention is a surface acoustic wave device comprising means to create surface acoustic waves and a thin layer of piezoelectric material in which the acoustic waves are guided, characterized in that the device comprises a carrier substrate and a layer of molecular bonder by which the thin layer of piezoelectric material is bonded to the carrier substrate.

The carrier material may be of the glass, sapphire, silicon or gallium arsenide type. The piezoelectric material may be of the quartz, lithium niobate or lithium tantalate type and the molecular bonder may be of the silica type. According to one variant of the invention, the surface acoustic wave device may include a metal layer between the layer of molecular bonder and the layer of piezoelectric material.

Yet another object of the invention is a first method for the manufacture of an acoustic wave device comprising a thin layer of piezoelectric material, a layer of molecular bonder and a carrier substrate.

More specifically, this method is characterized by the following steps:

- the deposition of a layer of molecular bonder on a first face of a piezoelectric material substrate,
- the joining of a carrier substrate and of the unit formed by the layer of molecular bonder and the piezoelectric material substrate under a wet atmosphere so as to carry out a hydrophilic bonding operation,
- the reduction of the thickness of the piezoelectric substrate by a mechanical, chemical or ion type of method so as to define the thin layer of piezoelectric material.

Advantageously, the method may comprise the following steps:

- the implantation of ions in the substrate of the piezoelectric material at a depth d with respect to a first face of a substrate of piezoelectric material;
- the fast heating of the assembly formed by the layer of molecular bonder and the piezoelectric material substrate so as to crack the piezoelectric material substrate at the depth of ion implantation and define the thin layer of piezoelectric material;
- the polishing of the thin layer of piezoelectric material.

BRIEF DESCRIPTION OF THE DRAWINGS

The invention will be understood more clearly and other advantages shall appear from the following description given as a non-restrictive example and from the appended figures, of which:

FIG. 1 illustrates a first exemplary surface acoustic wave device according to the invention comprising a transducer between two reflector arrays;

FIG. 3 illustrates an alternative embodiment of the invention in which the acoustic wave device comprises an additional metal layer for the confinement of the waves;

DESCRIPTION OF THE PREFERRED EMBODIMENTS

Figure 2A:
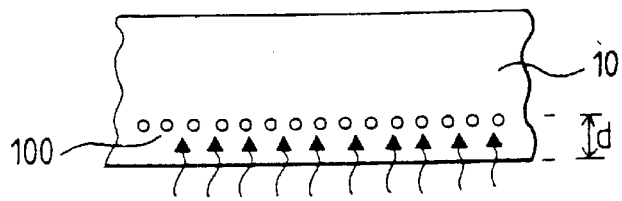
FIGS. 2a–2e illustrate the steps of one of the methods of manufacture used to obtain the acoustic wave device of the invention.

In general, the acoustic wave device comprises at least one layer of piezoelectric material 1 on which or in which the following elements are distributed: the electrodes 2 in order to fulfill the desired functions of transduction and reflection, a layer of molecular bonder 3 and a support substrate 4 as shown in FIG. 1 which more specifically represents an exemplary transducer inserted between two arrays of reflectors.

The thickness "t" of the layer of piezoelectric material is such that it leads to two guided modes of propagation of acoustic energy.

The thick of the layer of piezoelectric material is such that it leads to two guided modes of propagation of acoustic energy.

The layer of bonder known as "molecular" bonder is a layer of material capable of setting up hydrophilic type bonds with the materials at the interfaces. Typically, it may be silica which is capable in a wet atmosphere of setting up O—H type bonds with other materials at the interfaces also comprising oxygen atoms.

In practice, when a silicon type carrier substrate is used, it is possible to make an $SiO_2$ deposit by sputtering on the carrier substrate surface on a thickness of a few hundreds of Angstroms. This is also the case when the carrier substrate is made of gallium arsenide GaAs. It then becomes possible to set up bonds between the layer of $SiO_2$ and the piezoelectric materials that contain oxygen like quartz, $LiTaO_3$ or $LiNbO_3$.

With the structure chosen for the invention, by making fine thicknesses of piezoelectric materials limited to the dimensions of one acoustic wavelength, namely 1 $\mu$m to 30 $\mu$m, with the speed of the bulk acoustic waves becoming greater in the carrier substrate than in the layer of piezoelectric material, this layer of piezoelectric material may show the characteristics of an acoustic wave guide. Now, guided acoustic wave structures have several major advantages over conventional non-guided surface acoustic wave devices. These advantages are:

lower losses;

higher coefficients of reflection;

higher resistance to power, especially if the acoustic waves are polarized in a horizontal plane.

The acoustic wave device of the invention comprises a fine layer of piezoelectric material. The small thickness may be obtained by mechanical or chemical etching or, again, by plasma etching, from a thicker layer after joining by molecular bonding to the supporting substrate. However, for very thin layers, these techniques remain costly. This is why the invention proposes a method for making very thin layers. The main steps of this method are shown in FIG. 2.

The first step of the method consists of the implantation of ions, for example hydrogen type ions, in a piezoelectric substrate 10. The power of the ion bombardment regulates the depth d of ion implantation 100 (FIG. 2a).

Figure 2B:
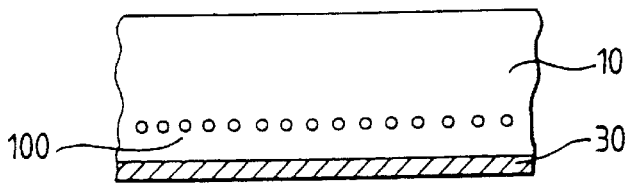

In a second step, a layer 30 of molecular bonder, which is for example of the $SiO_2$ type, is deposited. This deposit can be done by sputtering. The unit obtained is shown in FIG. 2b.

Figure 2C:
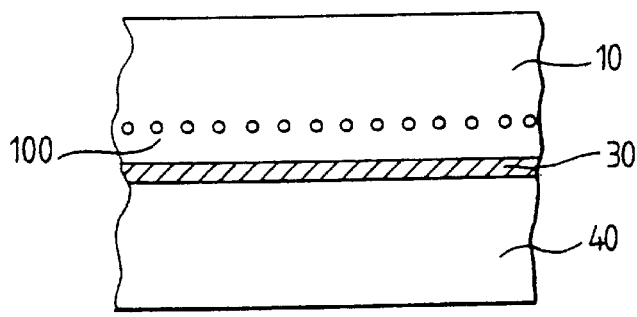

A third step shown in FIG. 2c consists in joining a carrier substrate 40 with the unit formed by the bonder 30 and the piezoelectric substrate 10. This operation can be done in a controlled atmosphere.

Figure 2D:
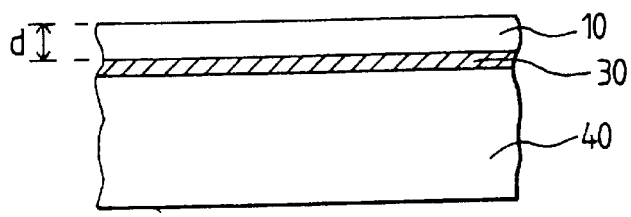
Figure 2E:
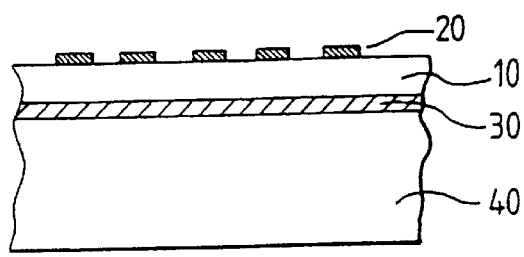

A fourth step shown in FIG. 2d is used to define the thin layer of piezoelectric material. This step is carried out through the fast heating of the unit prepared in the previous step. A cracking operation occurs in the implanted impurities. This cracking defines the piezoelectric layer with a thickness d. This cracking step is advantageously followed by a step of polishing the surface piezoelectric material. This step, which is not shown, comes before the fifth step shown in FIG. 2e which consists in defining the surface acoustic wave device (SAW device) by means of electrode depositing operations.

Figure 4A:
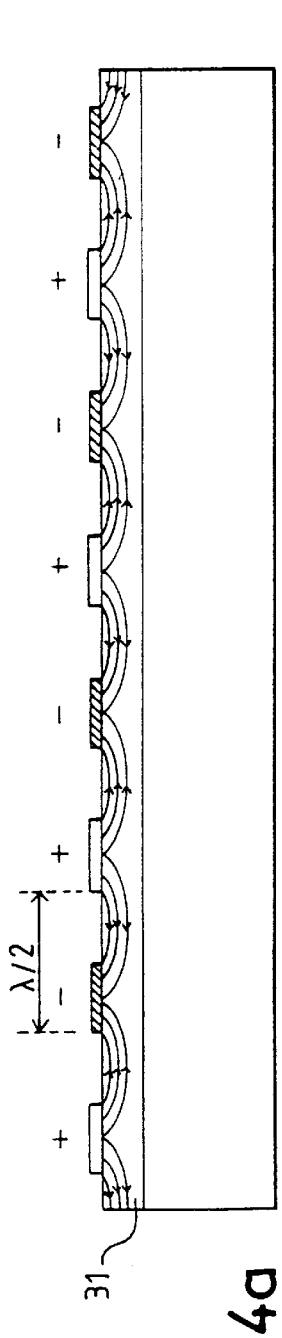
FIGS. 4a–4c illustrate configurations of transducers without conductive layer (4a) and with conductive layer (4b and 4c)
Figure 4B:
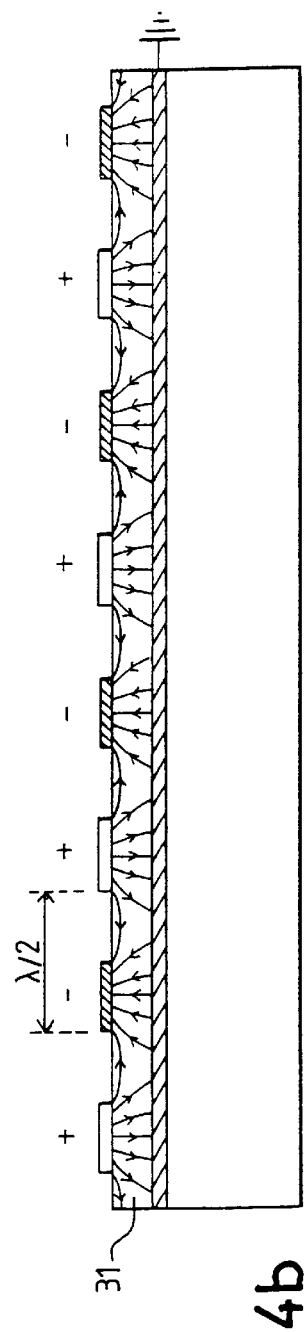

The surface acoustic wave device structure of the invention may be improved in a case of a silicon type carrier substrate in which there may be substantial losses owing to the low resistivity of the material. In this type of configuration, it may indeed be advantageous to insert a metal layer between the carrier substrate and the layer of molecular bonder as shown in FIG. 3. Thus, a carrier substrate 41 bears a metal layer 51, a layer of molecular bonder 31 and a thin layer of piezoelectric material 11 on which the electrodes 21 are deposited. The thin metal layer 51 is a conductive shield between the piezoelectric layer and the carrier substrate in such a way that the electrical field lines of the piezoelectric layer 11 are confined. The thin metal layer may be deposited on the surface of the piezoelectric substrate, on the carrier substrate, or on both of them. A layer of molecular bonder may then be deposited on the surface of the metal layer or of the carrier substrate or of the piezoelectric material. The insertion of a conductive layer has several advantages other than that of forming a shield against electrical fields. These advantages are illustrated especially by means of FIGS. 4a–4c. More specifically, FIG. 4a gives a schematic view of the field lines in the piezoelectric layer beneath a transducer when there is no conductive layer. FIG. 4b for its part gives a schematic view of the same phenomenon in the presence of a conductive layer. It must be noted that there is a deeper penetration of the field lines throughout the layer, in the second example. This results in an increase in the electroacoustic coupling coefficient of the transducer.

Depending on each case, the transducer may comprise unbalanced connections, namely the first connection is at a given potential and the second connection is still at a zero potential (i.e. connected to ground) or else balanced connections, namely two connections at the same potential but with a phase difference of 180°.

Figure 4C:
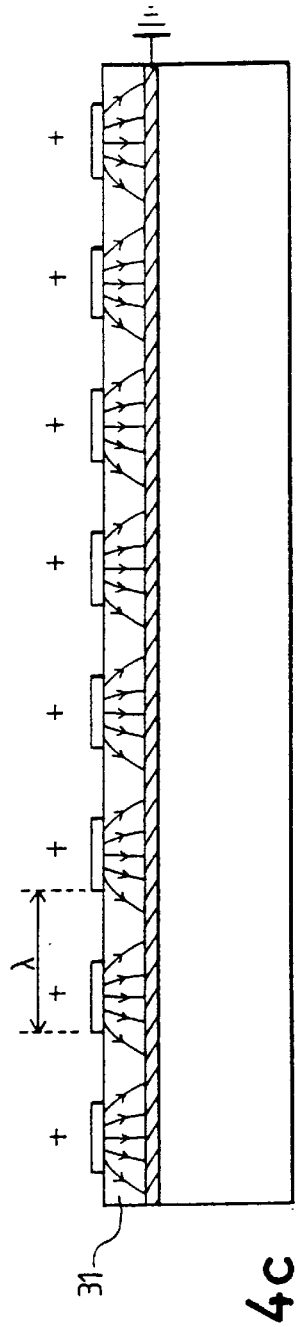

However, for optimum performance in the event of balanced or unbalanced supply, the conductive layer may be grounded; FIG. 4c shows another embodiment in which the second phase of the input signal is connected to the conductive face at the interface of the two substrates. This has the not negligible advantage of doubling the dimensions of the layout of interdigitated electrodes of a transducer. The periodicity of the electrodes required in this configuration is $\lambda$, where $\lambda$ is the acoustic wavelength whereas in the cases presented earlier, this periodicity was $\lambda/2$. FIG. 4c thus proposes a structure that can double the frequency of the operations of the device.

In cases where the carrier substrate has high resistivity, for example when it is made of glass or sapphire, an electrical shielding between the piezoelectric substrate and the carrier substrate is not necessary to prevent conductive losses in the carrier substrate. Hence, structures equivalent to those described in FIGS. 4a to 4c can be made by burying the electrodes as shall be illustrated here below. The advantages of these implantations are stronger piezoelectric coupling, because the electrodes are buried, and the shielding of the filter from external electrical fields.

It is also possible to obtain comparable effects by burying the electrodes of the transducer in the piezoelectric layer. This configuration makes it possible, in the same way as a buried conductive layer, to increase the depth of penetration of the electrical field lines inside the piezoelectric material.

In a prior art structure of surface acoustic wave devices, it is very difficult to obtain constant and reproducible performance characteristics with buried electrodes because it is very difficult to etch the piezoelectric substrate precisely to the required depth. By contrast, in the present invention, there is no difficulty in this respect. By choosing a method of selective chemical etching, it is possible to etch one precise position of the thin layer of piezoelectric material, and to etch solely this position in its totality. The grooves thus etched in the waveguide may be filled with metal by any of the existing techniques such as vapor deposition or sputtering. A transducer thus etched will have better coupling.

Figure 5A:
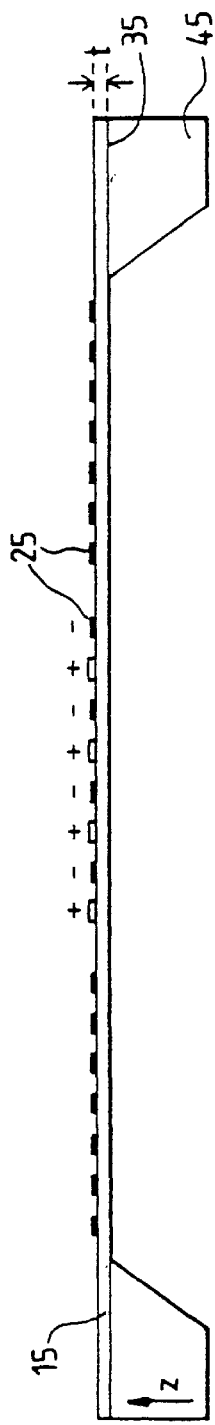
FIGS. 5a to 5c illustrate surface acoustic wave devices according to the invention comprising a hollowed carrier substrate.

According to another variant of the invention, it is advantageous to reduce the losses in the supporting material by hollowing out said carrier material beneath the active surface of the surface acoustic wave device. FIG. 5a illustrates a surface acoustic wave device in which the carrier substrate 45 is completely etched in a position facing the active zone of the piezoelectric material 15 comprising the electrodes 25, up to the layer 35 of molecular bonder. According to another variant, the layer of molecular bonder may also be etched. In the case of a silicon carrier substrate, it is possible to use well-known techniques of chemical etching or plasma etching.

Figure 5B:
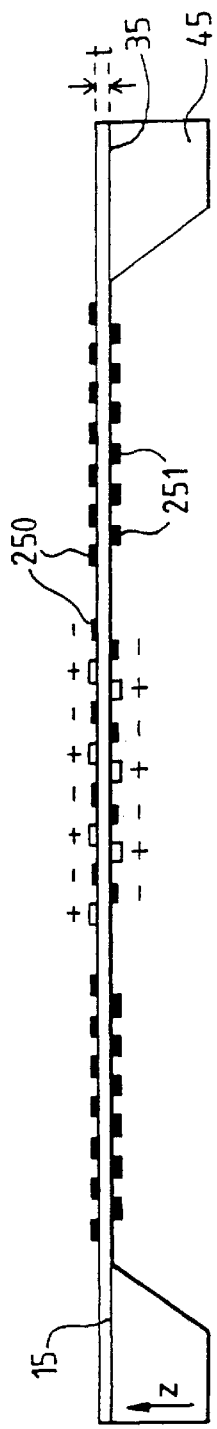

It may also be valuable, in the context of the invention, to make a one directional transducer out of the completely hollowed out support material as described above. FIG. 5b illustrates a transducer of this type. Starting with the thin piezoelectric layer, it is possible to make sets of electrodes on both faces of the piezoelectric substrate. A first set 250 is made on one of the faces and is then used as a mask in the making of the second set 251, inasmuch as the piezoelectric substrate is transparent to the insolation wavelengths used in the lithographic methods for making electrodes.

Figure 6:
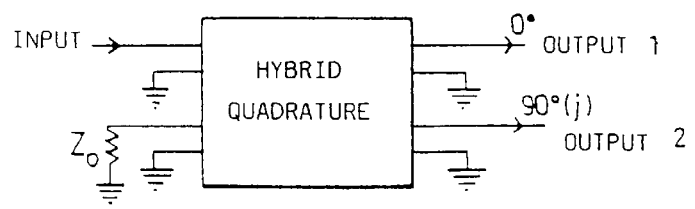
FIG. 6 illustrates a mode of control of a one-directional transducer according to the invention.

To obtain acoustic energy radiation in a single direction, the transducer is supplied with two inputs with a phase difference of 90°. A power supply of this kind can easily be obtained by means of a quadrature hybrid illustrated in FIG. 6, known in the prior art. In this case, the electrodes on the upper surface are powered with the output 1 and the electrodes on the lower surface are powered with the output 2. A one-way transducer made in this way is a wideband transducer, and it is highly efficient.

Figure 5C:
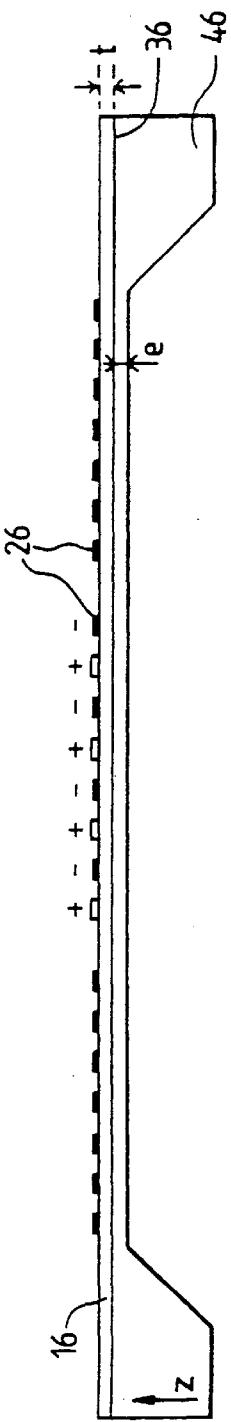

It must be noted that the hollowing of a carrier substrate can be useful even when the resistivity of the carrier material is sufficient. For example, depending on the piezoelectric material and the carrier material, the support can be hollowed out, leaving only a specified thickness e of material beneath the surface acoustic wave device, as illustrated in FIG. 5c. Indeed, facing the electrodes 26 laid out on the surface of the thin layer of piezoelectric material 16, bonded by a layer 36 of bonder to the support substrate 46, this substrate 46 is hollowed out up to a thickness e of support material. This kind of architecture can be used to compensate for temperature variations and thus greatly reduce the sensitivity of the device to temperature.

Figure 7A:
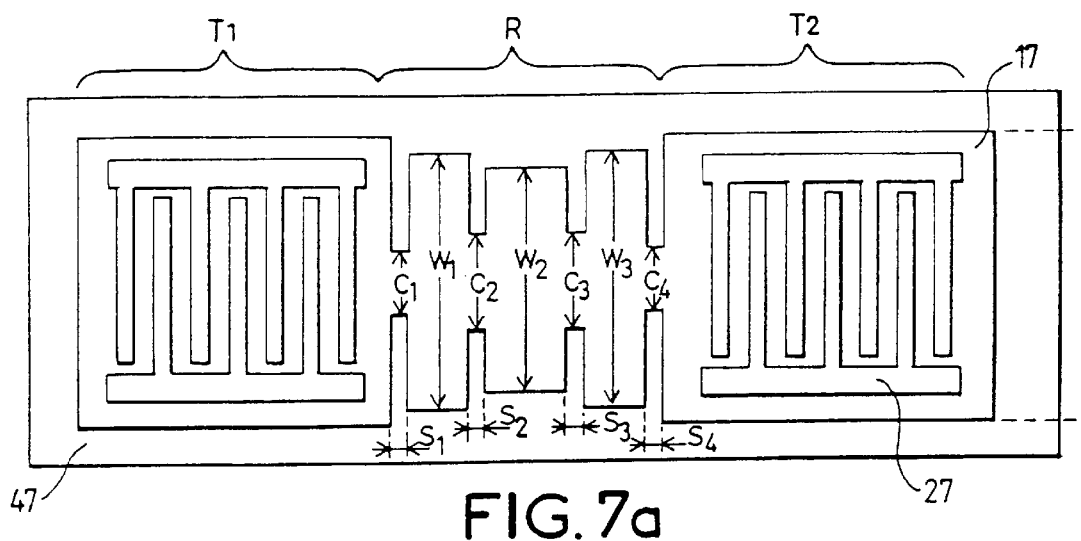
FIGS. 7a–7c illustrates an exemplary filter using a surface acoustic wave device according to the invention, with surface electrodes or buried electrodes.
Figure 7B:
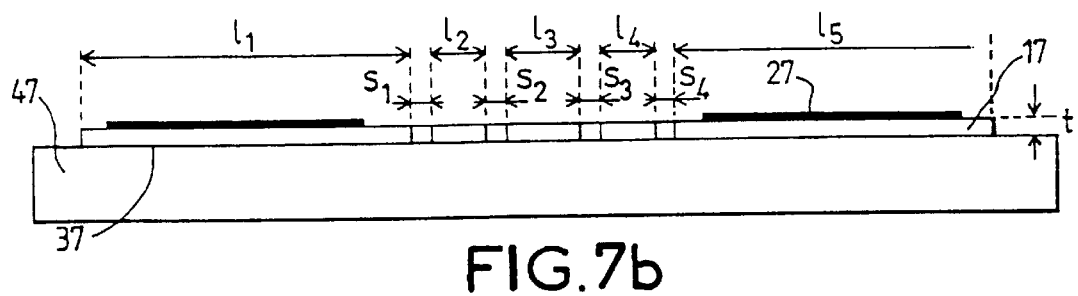

As referred to here above, the surface acoustic wave (SAW) device of the invention, owing to its thin layer of piezoelectric material, has reflection coefficients that are greater than or in the region of 100% if arrays are etched in the guide made of piezoelectric material. Indeed, in structures of this kind, the energy is not lost or it is dispersed in the form of bulk waves. Furthermore, since the energy is confined entirely within the guide, very high levels of reflection and insolation are obtained in the different sections of the waveguide by etching it, thus reducing its height and/or its width. In this context, FIG. 7 illustrates the making of a low loss filter that is highly efficient especially because of the high reflection coefficients. This is a filter constituted by two transducers $T_1$ and $T_2$ separated by an array R, obtained by different etchings of the piezoelectric guide. FIG. 7a illustrates a top view of the SAW device and FIG. 7b a sectional view of it. The thin piezoelectric waveguide 17 is etched up to the layer 37 of molecular bonder or up to the carrier substrate 47 by chemical or plasma etching for example. Then, a pattern of electrodes 27 is defined so as to obtain a series of resonant cavities in lines, for which each resonance frequency is a function of the cavity wavelength In (in the example $1 \leq n \leq 5$).

The impedance of each of the cavities can be modified by changing the width of the acoustic waveguide in each section Wn.

The coupling between each of the cavities is controlled by the aperture of the guide Cn and the length of the slots Sn. According to this method, an acoustic filter may be made in exactly the same way as a standard guided electromagnetic wave filter. The length of each internal cavity is only about $\lambda/2$. A filter of this kind may therefore be smaller than the prior art surface acoustic wave filters whose arrays of reflectors require internal cavities in the range of $100\lambda$.

Figure 7C:
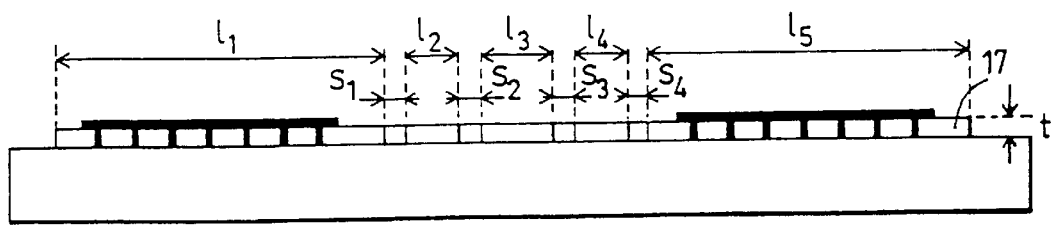

FIG. 7c shows an alternative filter in which the electrodes of the transducers are hollowed out in the piezoelectric substrate instead of being in the plane. As explained here above, the transducers thus have improved coupling and can be used to make smaller-sized filters.

In accordance with a variant of the structures shown in FIGS. 7a and 7b, the coupling is at the side rather than in-line.

The invention also relates to SAW devices whose packaging is worthwhile in terms of cost and size.

Indeed, the cost of encapsulation, which should usually be a hermetically sealed packaging, is presently a major part of the cost of production of the component. In large-scale production, it is important to reduce this price as far as possible. In this context, it may be very worthwhile to use also a thin layer of molecular bonder to bond an encapsulation lid to the fine layer of piezoelectric material.

Figure 8A:
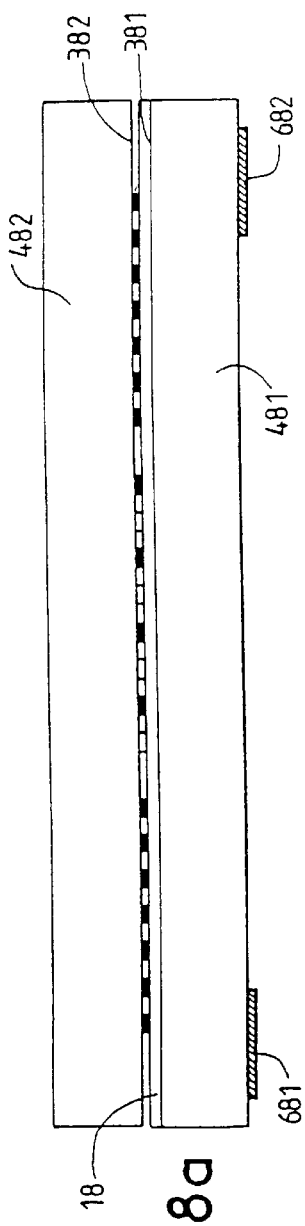
FIGS. 8a, 8b and 8c illustrate exemplary encapsulated surface acoustic wave devices according to the invention.

FIG. 8a shows a first example of a surface acoustic wave device in which the electrodes are integrated into a thin layer 18 of piezoelectric material, said piezoelectric material being bonded by means of a layer 381 of molecular bonder to a first carrier substrate 481. A second carrier substrate 482 is also bonded by means of a layer 382 of molecular bonder to the layer of piezoelectric material so as to provide for the encapsulation. A package according to this approach is a highly robust full package (i.e. without a cavity). Provided that the speed of the bulk waves in the carrier substrate is greater than it is in the guide, it is possible to obtain very low propagation losses. In a standard manner, conductive pads 681 and 682 set up electrical connections, through the substrate 481, with the surface acoustic wave component.

Figure 8B:
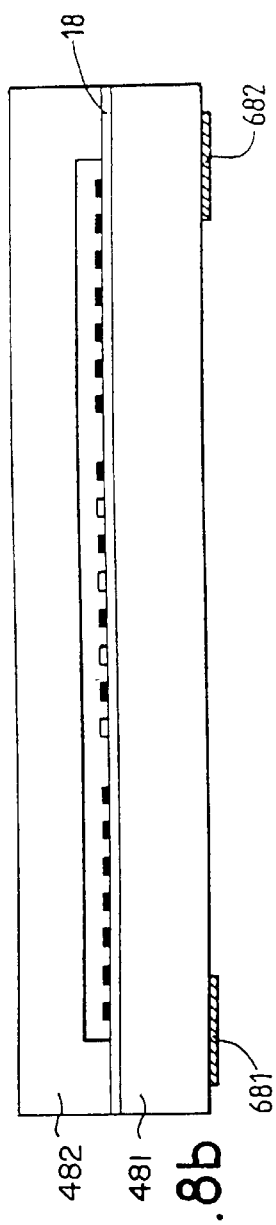
Figure 8C:
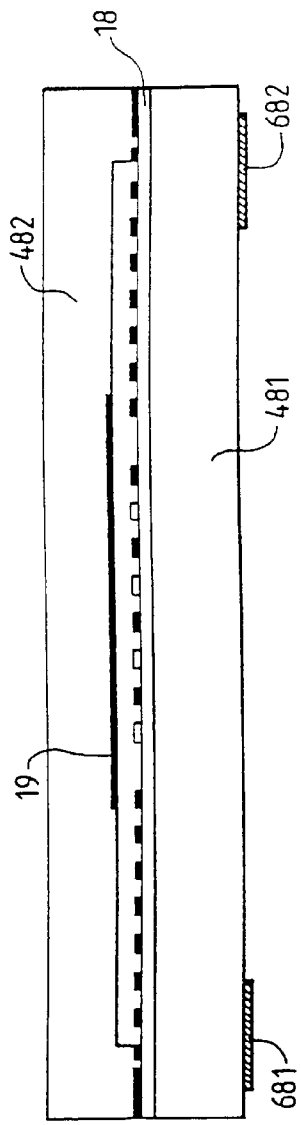

FIG. 8b illustrates a second example of a surface acoustic wave device (herein represented by a transducer between two reflecting arrays) with electrodes that are on the surface and no longer integrated. A locally hollowed carrier substrate is bonded at its the periphery to a layer of piezoelectric material by means of a layer of molecular bonder. This approach, as compared with the previous one, has the advantage of not modifying the measured characteristics of the acoustic wave device before the bonding of the upper carrier substrate. In the structure shown in FIG. 8c, the absence of a cavity indeed leads to a different response of the device after bonding of the carrier substrate. This complicates the testing of the device during the production process. Furthermore, the hollowed carrier substrate is used as an encapsulation package lid may advantageously include active components, 19, components for adaptation or any other components integrated into the package as shown in FIG. 8c. If the interior of the cavity is metallized, it also enables a particularly valuable electrical shielding in the RF applications.

Figure 9:
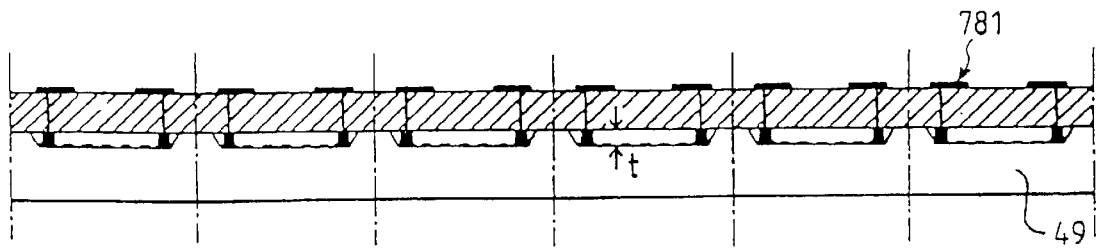
FIG. 9 illustrates another exemplary encapsulated surface acoustic wave device according to the invention.

FIG. 9 shows a variant of surface acoustic wave devices encapsulated collectively. In this case, cavities are etched in the piezoelectric substrate 49. Then, a metallization is done and the photolithography step is carried out and finally the piezoelectric substrate is bonded to the ceramic carrier (for example) with via holes and metallizations 781. The last step consists in separating the components mechanically with a saw.

What is claimed is:

1. Surface acoustic wave device comprising:
    means for creating surface acoustic waves;
    a thin layer of piezoelectric material in which the acoustic waves are guided;
    a carrier substrate; and
    a layer of molecular bonder by which the thin layer of piezoelectric material is bonded to the carrier substrate, wherein the means for creating surface acoustic waves is located in a central part of the piezoelectric material, and the carrier substrate is hollowed out in front of said central part.

2. Surface acoustic wave device according to claim 1, characterized in that the carrier material may be of the glass, sapphire, silicon or gallium arsenide type.

3. Surface acoustic wave device according to claim 1, characterized in that the molecular bonder is silica.

4. Surface acoustic wave device according to claim 3, characterized in that the thickness of the layer of molecular bonder is in the range of some hundreds of Angstroms.

5. Surface acoustic wave device according to claim 1, characterized in that it comprises a metal layer between the layer of molecular bonder and the layer of piezoelectric material.

6. Surface acoustic wave device according to claim 1, characterized in that the piezoelectric material is of the quartz, lithium niobate or lithium tantalite type.

7. Surface acoustic wave device according to claim 1, characterized in that the thickness of the layer of piezoelectric material is in the range of one acoustic wavelength of about 1 $\mu$m to 30 $\mu$m.

8. Surface acoustic wave device according to claim 1, characterized in that it comprises electrodes integrated into the thin layer of piezoelectric material.

9. Surface acoustic wave filter according to claim 1, characterized in that it comprises two transducers separated by an array of reflectors etched in the thin layer of piezoelectric material, so as to define a series of resonant cavities in lines with a length of In.

10. Surface acoustic wave device according to claim 1, characterized in that the carrier substrate is completely hollowed out up to the thin layer of piezoelectric material and in that it comprises a first series of electrodes on a first face of the layer of piezoelectric material and a second series of electrodes on the face opposite to the first face of the layer of piezoelectric material.

11. Module comprising a surface acoustic wave device according to claim 1, and an encapsulation package into which the device is integrated, characterized in that the encapsulation package comprises a second carrier substrate bonded by a second layer of molecular bonder on at least one part of the layer of piezoelectric material.

12. Module according to claim 11 characterized in that the second carrier substrate is bonded by a second molecular layer to the entire layer of piezoelectric material.

13. Module according to claim 11, characterized in that the second carrier substrate is hollowed out at its center and bonded at its periphery to the periphery of the layer of piezoelectric material.

14. Method for the manufacture of an acoustic wave device comprising:
    implanting ions in a substrate of piezoelectric material at a depth d with respect to a first face of the substrate of piezoelectric material;
    depositing a layer of molecular bonder to the first face of the substrate of piezoelectric material;
    joining a carrier substrate to the layer of molecular bonder on the piezoelectric material under a wet atmosphere so as to carry out a hydrophilic bonding operation;
    fast heating the assembly formed by the carrier substrate, the layer of molecular bonder and the piezoelectric material substrate so as to crack the piezoelectric material substrate at the depth of ion implantation and define the thin layer of piezoelectric material; and
    polishing the thin layer of piezoelectric material.

* * * * *